(12) United States Patent  
Sellars et al.

(10) Patent No.: US 7,929,938 B2
(45) Date of Patent: Apr. 19, 2011

(54) DC-COMPENSATED IP2 CALIBRATION FOR WCDMA RECEIVER

(75) Inventors: Shawn Sellars, Ottawa (CA); Jose Macedo, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 605 days.

(21) Appl. No.: 12/051,739

(22) Filed: Mar. 19, 2008

(65) Prior Publication Data

US 2009/0239495 A1 Sep. 24, 2009

(51) Int. Cl.
*H04B 1/28* (2006.01)

(52) U.S. Cl. ........ 455/333; 455/313; 455/323; 455/341; 455/318; 327/113

(58) Field of Classification Search .................. 455/333, 455/313, 323, 341, 318; 327/113
See application file for complete search history.

(56) References Cited

U.S. PATENT DOCUMENTS

| 6,140,849 | A * | 10/2000 | Trask | 327/113 |
| 6,304,142 | B1 * | 10/2001 | Madni | 330/254 |
| 6,959,178 | B2 * | 10/2005 | Macedo et al. | 455/313 |
| 2007/0077907 | A1 * | 4/2007 | Rector | 455/323 |

* cited by examiner

*Primary Examiner* — Sanh D Phu
(74) *Attorney, Agent, or Firm* — Michael J. Tempel; Smith Frohwein Tempel Greenlee Blaha LLC

(57) ABSTRACT

Second-order intermodulation distortion can be suppressed in a direct conversion radio receiver having a downconversion mixer by calibrating resistors and a current source in the mixer. A test signal is applied to the signal inputs of the mixer transconductor. The resistances of first and second variable resistor circuits connected to the switching quad are then varied while also varying a variable current source. Each time the resistances and current are set to new values, the resulting mixer output signal is measured. When the measured output signal is determined to be at a minimum, the variable resistors and current source are left at the corresponding values to which they have been set. Adjusted in this manner, the current source counteracts the DC offset voltage at the mixer output.

6 Claims, 3 Drawing Sheets

DC-COMPENSATED IP2 CALIBRATION FOR WCDMA RECEIVER

BACKGROUND

In wireless telephone and similar transceiver circuitry, a direct-conversion receiver can provide advantages over a superheterodyne receiver, including lower power consumption due to the absence of an intermediate frequency mixer, and smaller integrated circuit die area consumption due to less complex circuitry. However, conventional direct-conversion receiver architectures can suffer from poor sensitivity due to second-order distortion. For example, in Wideband Code Division Multiple Access (WCDMA) transceivers, in which a transmit signal is present while the receiver is receiving information, second order distortion in the receiver causes second-order intermodulation products of the transmit signal to fall coincident with signal to be received. As the transmit signal can be 60-80 dB larger than the signal to be received, features must be included in the receiver to enhance second-order performance to provide sufficient sensitivity to receive the signal. Second-order intermodulation distortion is typically expressed in terms of a second-order intercept point (IP2) value, in units of dBm.

In a conventional direct conversion receiver, a signal received at the antenna is downconverted by two mixers that combine the received signal received with in-phase (I) and quadrature (Q) signals produced by a local oscillator. It has been proposed to optimize the IP2 in such a receiver by adjusting the mixer parameters. Each mixer is generally implemented as a transconductor comprising a differential pair of transistors plus a "switching quad" comprising four transistors. It has been proposed to optimize receiver IP2 by adjusting the direct current (DC) at the switching quad. However, such a method can degrade the I/Q balance of the receiver and degrade signal-to-noise ratio. It has also been proposed to optimize receiver IP2 by tuning the load resistors in the mixer quad to match the positive and negative differential path gains and thereby eliminate or compensate for second-order intermodulation products. This approach may work well enough in a voltage-mode mixer, but in a current-mode mixer it can cause a large DC offset that adversely affects baseband circuitry operation.

SUMMARY

Second-order intermodulation products can be suppressed in a direct conversion radio receiver having a downconversion mixer by adjusting resistors and a current source in the mixer. In an exemplary embodiment, the downconversion mixer has a transconductor and a switching quad that acts as a multiplier. The switching quad has first and second variable resistor circuits and further has a variable current source circuit coupled to its outputs. A test signal is applied to the RF signal input nodes of the transconductor, which may be implemented as a differential pair of transistors. The resistances of the first and second variable resistor circuits of the switching quad are then varied (e.g., stepped from one value to another) while also varying a current of the variable current source. Each time the resistances and current are set to a new value, the resulting mixer output signal is measured. When the measured output signal is determined to be at a minimum, the variable resistors and current source are left at the corresponding values to which they have been set. Adjusted in this manner, the current source counteracts the DC offset voltage at the mixer output.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
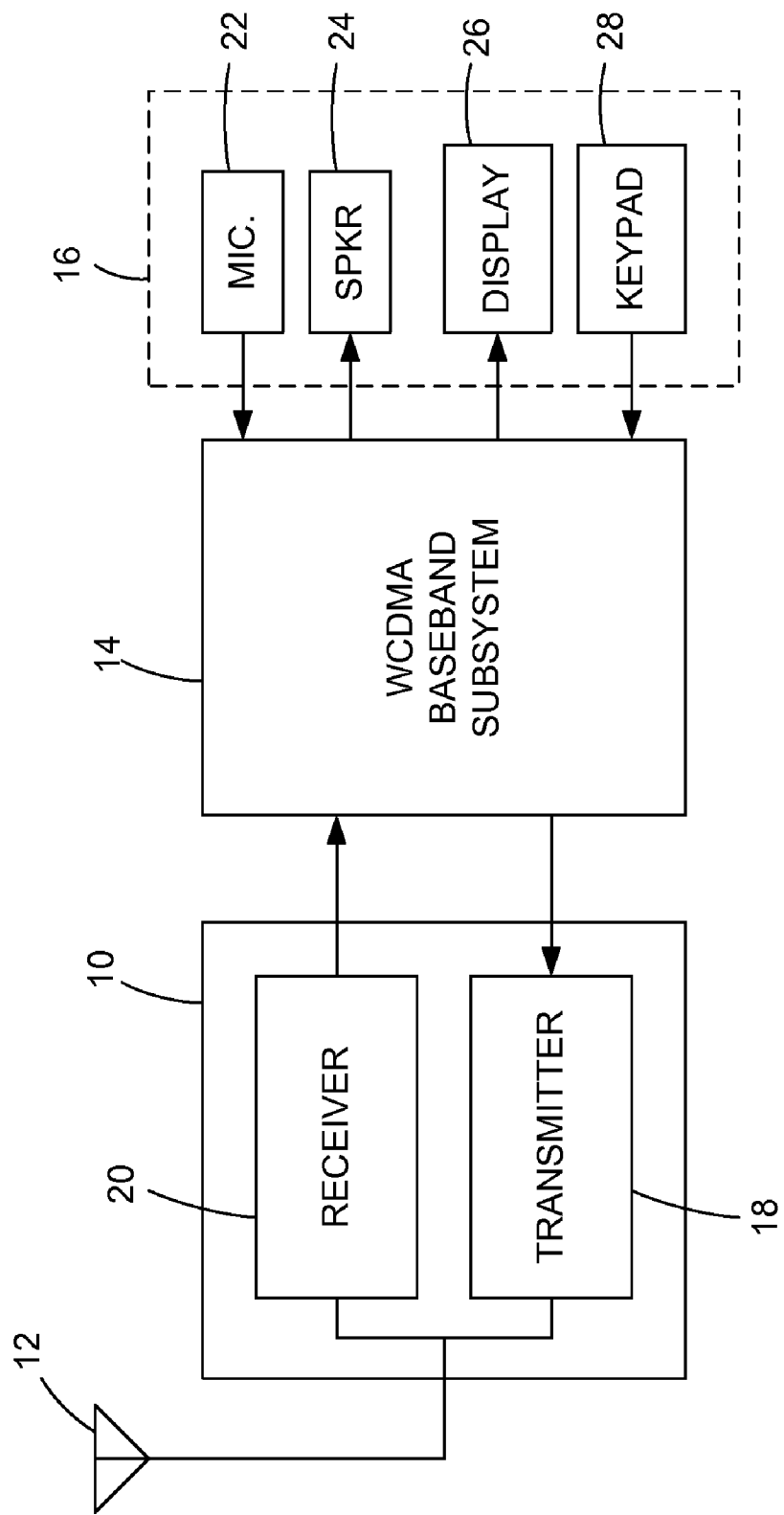
FIG. 1 is a block diagram of a mobile wireless telephone, in accordance with an exemplary embodiment of the present invention.

As illustrated in FIG. 1, in accordance with an exemplary embodiment of the invention, a mobile wireless telephone (e.g., a cellular telephone) or similar mobile wireless user equipment includes a radio frequency (RF) subsystem 10, an antenna 12, a baseband subsystem 14, and a user interface section 16. The RF subsystem 10 includes a transmitter 18 and a receiver 20. User interface section 16 includes a microphone 22, a speaker 24, a display 26, and a keyboard 28, all coupled to baseband subsystem 14. In the exemplary embodiment, the telephone conforms to the well-known Wideband Code-Division Multiple Access (WCDMA) standards, but in other embodiments it can conform to CDMA or any other suitable mobile wireless telephony standards. In accordance with such standards, receiver 20 is of the direct-conversion type. However, unlike conventional direct-conversion receivers, receiver 20 neither is hampered by second-order distortion nor produces a large DC offset voltage that could hamper operation of baseband subsystem 14.

Figure 2:
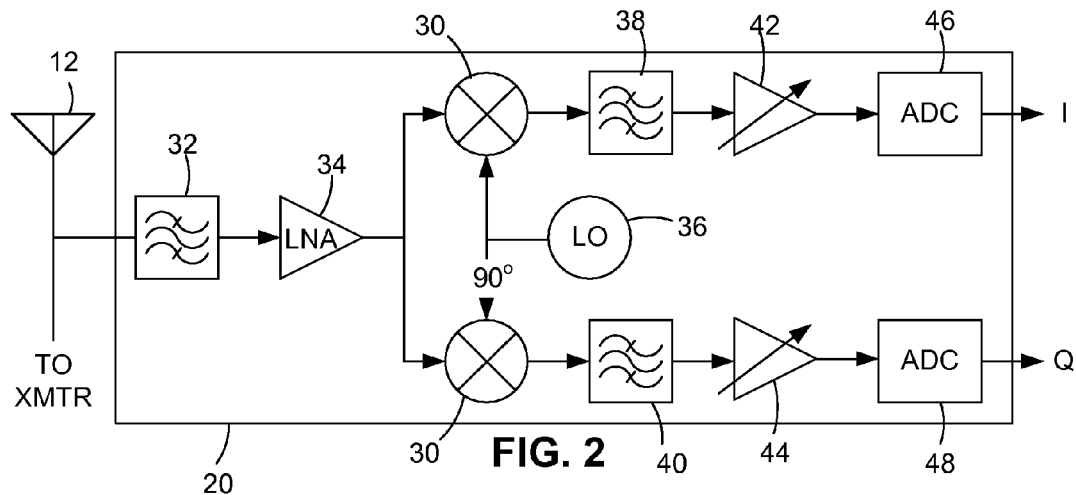
FIG. 2 is a block diagram of a receiver portion of the wireless telephone of FIG. 1.

With reference to FIG. 2, receiver 20 can be of conventional design but for the novel mixer circuits 30. Accordingly, receiver 20 further includes a bandpass filter 32, a low-noise amplifier (LNA) 34, a local oscillator (LO) 36, two channel filters 38 and 40, two variable-gain amplifiers (VGAs) 42 and 44, and two analog-to-digital converters 46 and 48. As well understood in the art, filter 32 filters the RF signal received from antenna 12 and provides the filtered signal to LNA 34. Although a single LNA 34 is shown in FIG. 2, persons skilled in the art to which the invention relates understand that a plurality of LNAs are commonly included, depending upon the frequency or frequencies on which the mobile wireless telephone operates. The LNA 34 amplifies the weak RF signal to a level at which a downconversion circuit, comprising the remaining circuit elements shown in FIG. 2, operates. The downconversion circuit operates by providing signals from LO 36 to each of mixer circuits 30, then providing the outputs of mixer circuits 30 to respective channel filters 38 and 40. The signals provided by LO 36 can comprise an in-phase (I) oscillator signal and a phase-shifted oscillator signal, e.g., shifted 90 degrees from the in-phase oscillator signal, referred to as a quadrature (Q) signal. The outputs of mixers 30 likewise comprise an I output and a Q output. Channel filters 38 and 40, one receiving the I output and the other receiving the Q output, select the one desired channel and reject all others. The VGAs 42 and 44 amplify the filtered I and Q signals, respectively. The ADCs 46 and 48 converts the amplified signals to digital form. The digitized I and Q signals are provided to baseband subsystem 14 (FIG. 1) for further processing.

Figure 3:
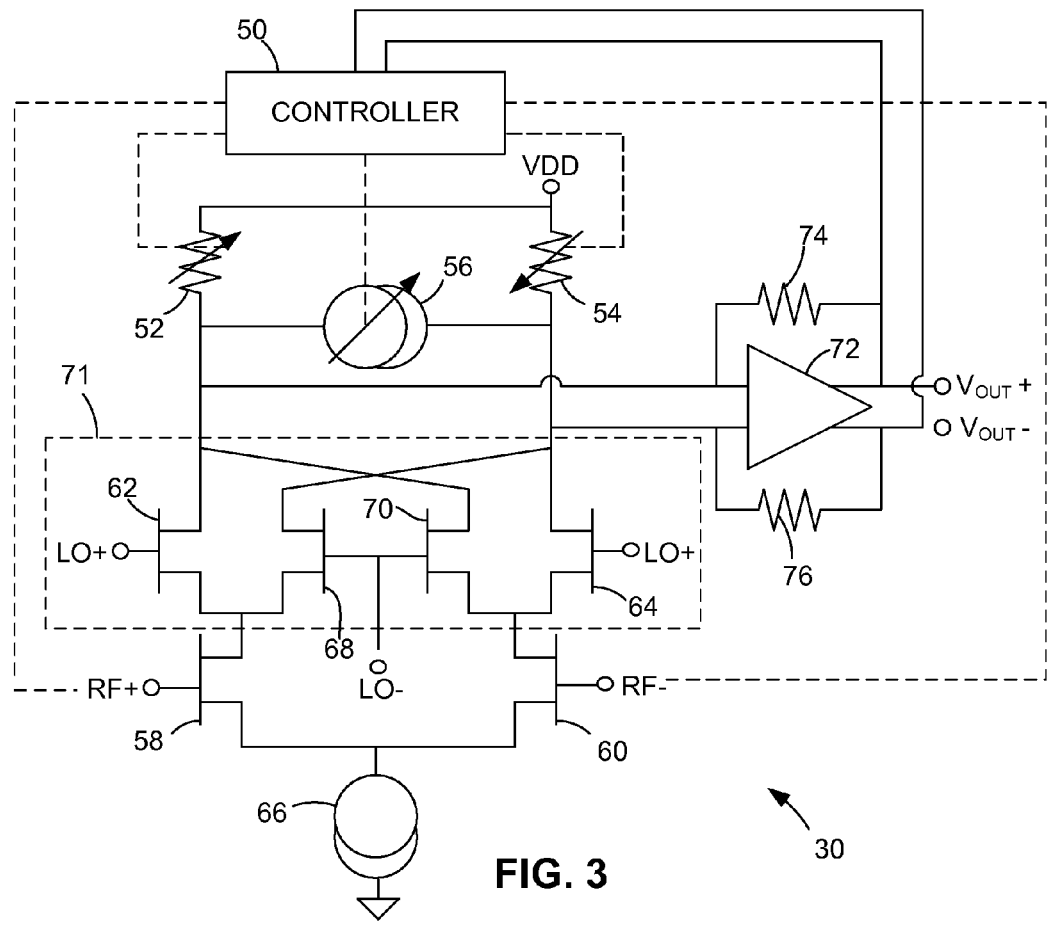
FIG. 3 is a block diagram of a mixer circuit of the receiver of FIG. 2.

As illustrated in FIG. 3, in an exemplary embodiment of the invention, mixer circuit 30 comprises a controller 50 that controls two variable resistors 52 and 54 and a variable current source 56. Mixer circuit 30 operates in the manner of a conventional Gilbert cell by multiplying the RF signal (output of LNA 34 in FIG. 2) that is provided between the gate terminals of transistors 58 and 60 by the LO signal (output of LO 36 in FIG. 2) that is provided between the gate terminals of transistors 62 and 64 and transistors 68 and 70. Transistors 58 and 60 are connected as a differential pair and are coupled together at their source terminals to a current source 66. Transistors 62, 64, 68 and 70 form the switching quad 71, which acts as a multiplier core. Furthermore, transistors 58 and 60 act as a transconductor that converts the differential input voltage (RF+, RF−) into a differential current that then feeds switching quad 71. The outputs of switching quad 71 are coupled through variable (pull-up) resistors 52 and 54 to a supply voltage $V_{DD}$. Variable current source 56 is disposed between the outputs of switching quad 71 for reasons discussed below.

Variable resistors 52 and 54 and variable current source 56 can have any suitable structure and can be stand-alone elements or integrated with other circuit elements. Regardless, each has associated with it a register (not shown in FIG. 3 for purposes of clarity) or other means by which controller 50 can set or program its resistance or current value. For example, in an embodiment in which registers are included, controller 50 sets the resistance of variable resistors 52 and 54 by writing a control word to a resistor circuit register (or two registers, in embodiment in which each of variable resistors 52 and 54 has a separate register associated with it) and sets the current of variable current source 56 by writing a control word to a current source circuit register. Such registers are not separately shown in FIG. 3 for purposes of clarity, but they can be integral to variable resistors 52 and 54. In other embodiments, they can be included in the controller or still other circuit elements. Once the resistance and current have been set, they remain at the values to which they have been set until such time as they may be set again.

The transimpedance amplifier has a conventional structure, comprising an operational amplifier 72 and two resistors 74 and 76. The transimpedance amplifier translates the current between the above-described outputs of mixer quad 71 into an output voltage. The output voltage not only serves as the output of mixer circuit 30 but is also fed back to controller 50. Controller 50 can measure this output voltage.

In the manner described below with regard to the method shown in FIG. 4, controller 50 measures the output voltage and, in response, controls variable resistors 52 and 54 and variable current source 56 to calibrate mixer circuit 30 in a manner that minimizes the second-order product. The calibration method can be performed at any suitable time, such as in a manufacturing environment in which the mobile wireless telephone is being manufactured, or periodically (e.g., every 30 days, every six months, etc.) during the lifetime of the telephone. Note that it would be possible to use the calibration method to compensate for IP2 degradation due to temperature. In a manufacturing environment, controller 50 can comprise an instrument external to the mobile wireless telephone, connected to the telephone circuitry with suitable temporary connections, such as test leads or probes, while the calibration is performed. In such an embodiment, controller 50 can comprise any suitable circuitry that performs the functions or steps described below, including hard-wired or programmable logic (e.g., a processor, memory, etc.). In embodiments in which the method is performed apart from a manufacturing environment, such as an embodiment in which the mobile wireless telephone performs the method internally every so many days, some or all of the functional elements attributed herein to controller 50 can be included as part of, i.e., integrated with, other mobile wireless telephone elements, such as a processor (not shown) that controls other mobile wireless telephone operations. For example, the processor can be that which is conventionally included in baseband subsystem 14 (but which is not separately shown in FIG. 3 for purposes of clarity). In embodiments in which a processor is used, it is provided with programming or configuration logic that causes it to effect the novel method described below with regard to FIG. 4 and, correspondingly, to assume a novel structure in accordance with its programming or configuration logic.

Figure 4:
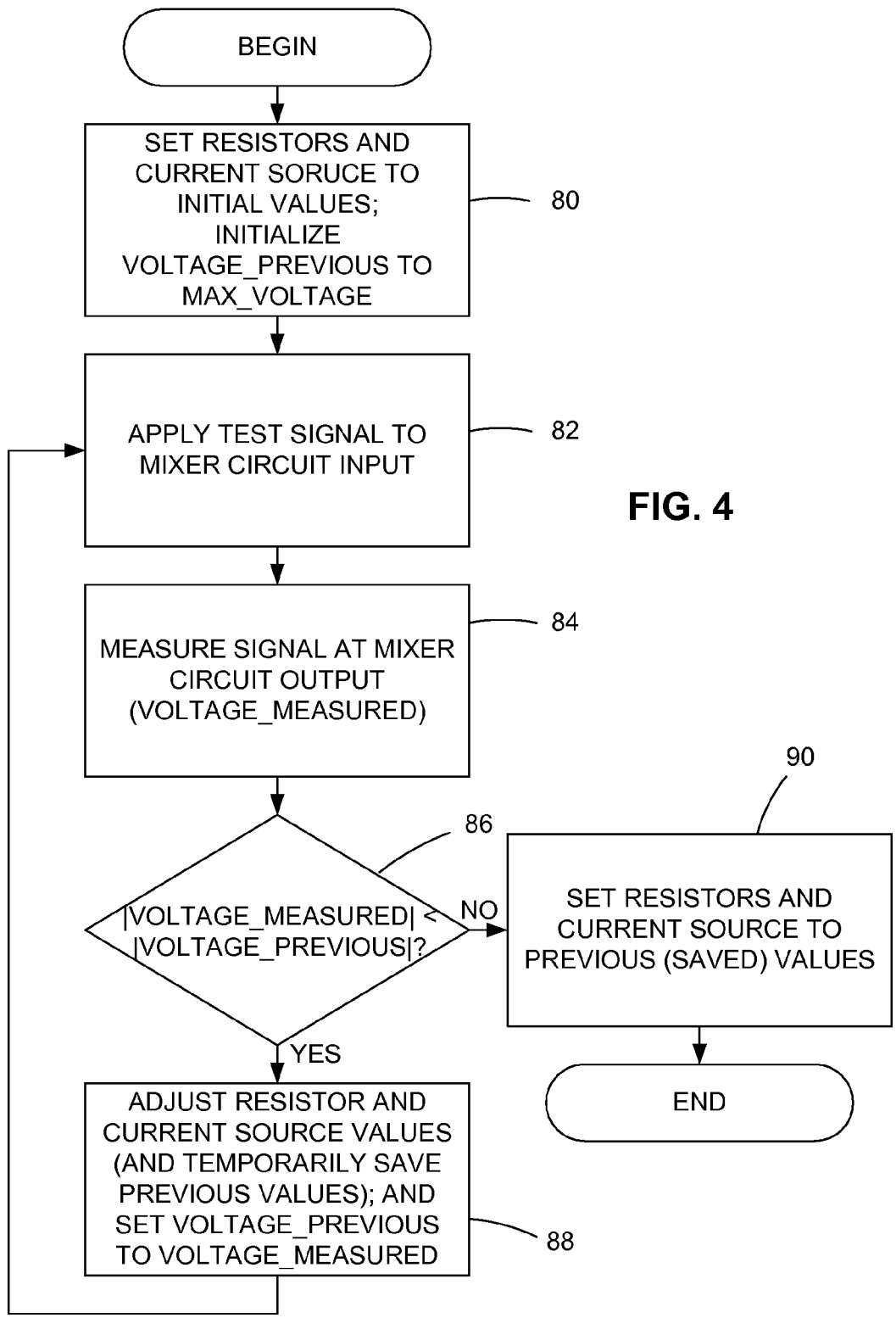
FIG. 4 is a flow diagram of an exemplary method of operation for the receiver mixer circuit of FIG. 3.

As illustrated in FIG. 4, at step 80 controller 50 sets each of variable resistors 52 and 54 to an initial value, such as the mid-point of the range of values to which they are capable of being set. Variable resistors 52 and 54 can be, for example, settable in discrete steps of 0.2 ohms, from a minimum of 187.4 ohms to a maximum of 212.6 ohms. Controller 50 also sets variable current source 56 to an initial value. The resistance value to which each of variable resistors 52 and 54 is set, and the current value to which variable current source 56 is set, can be related. Fore example, the resistance value and current value can be set simultaneously by writing a common control word to both a register that controls the resistance value and a register that controls the current value. Thus, for each resistance value to which variable resistors 52 and 54 can be set, there is exactly one current value to which variable current source 56 can be set.

Controller 50 also sets or initializes any variables or similar quantities that are to be measured, compared, or otherwise used in the method, such as a quantity referred to in a pseudocode context as "VOLTAGE_PREVIOUS". Controller 50 can set VOLTAGE_PREVIOUS to a predetermined maximum voltage (referred to as "MAX_VOLTAGE" in FIG. 4) that mixer circuit 30 is capable of outputting in response to the input signals to be applied. For example, in an embodiment in which current source 66 draws 2 milliamps (mA) of tail current per side, and each of variable resistors 52 and 54 is adjustable between 187.4 ohms to a maximum of 212.6 ohms, the maximum differential DC output voltage that mixer circuit 30 could generate as a result of the calibration method would be 50.4 millivolts (mV).

At step 82, controller 50 generates and applies a test signal to the input of mixer circuit 30. In an embodiment in which the method is performed during manufacturing, the test signal can be applied across transistors 58 and 60 (mixer circuit inputs labeled "RF+" and "RF−" in FIG. 3), before mixer circuit 30 is integrated into receiver 20. The test signal can comprise a single frequency, e.g., an unmodulated sinusoid, or a plurality of frequencies, e.g., a dual-frequency signal. As the test signal is intended to produce an effect similar to that which would be produced if, in actual operation of a mobile wireless telephone, the RF input signal were an out-of-band blocking signal, the test signal preferably has an amplitude near the maximum that receiver 20 is capable of receiving. For example, in an embodiment in which receiver 20 is capable of receiving an RF signal no larger than about −104 dBm (which is the minimum signal level according to the CDMA standard), the test signal can be on the order of −30 dBm. Also, the test signal is preferably out of the channel frequency band to which receiver 20 is tunable in actual operation. Although in the exemplary embodiment controller 50 is shown as both generating the test signal and performing the other steps of the method, in other embodiments the test signal can be generated by a separate device, which can be either an element internal to the mobile wireless telephone (or one of its constituent elements) or external test equipment.

At step 84, controller 50 measures the differential voltage at the output of the transimpedance amplifier (labeled $V_{OUT}+$ and $V_{OUT}-$ in FIG. 3). In an embodiment in which the test signal has a single frequency, the output signal will be DC. In an embodiment in which the test signal has two frequencies, the output signal will have a frequency equal to the difference between the two frequencies of the test signal. In the case of the latter type of embodiment, the root-mean-square (RMS) voltage of the output signal can be measured at step 84.

At step 86, controller 50 compares this output voltage ("VOLTAGE_MEASURED") with VOLTAGE_PREVIOUS to determine if VOLTAGE_MEASURED is less than ("<") VOLTAGE_PREVIOUS. (More specifically, as the voltage can be either positive or negative as it is driven toward zero, it is the absolute values of these voltages that are compared at step 86.) As VOLTAGE_PREVIOUS was initialized to a maximum value, VOLTAGE_MEASURED will be less than VOLTAGE_PREVIOUS on the first iteration. Therefore, at step 88 controller 50 adjusts the resistance values to which it sets variable resistors 52 and 54 and the current value to which it sets variable current source 56. For example, controller 50 can adjust or increment variable resistor 52 upward by one step and adjust or decrement variable resistor 54 downward by one step. Controller 50 adjusts variable resistors 52 and 54 in opposite directions in this manner because the gains of the left and right sides of mixer circuit 30 differ slightly. Adjusting one of variable resistors 52 and 54 upwards while adjusting the other of resistors 52 and 54 downwards allows the gains to be equalized.

Also at step 88, controller 50 saves the values to which variable resistors 52 and 54 and variable current source 56 were previously set, i.e., before they were adjusted, and sets VOLTAGE_PREVIOUS to VOLTAGE_MEASURED. The method then returns to step 80 (indicating that controller 50 continues to apply the test signal). The method proceeds through another iteration of the above-described loop (comprising steps 80, 82 and 84). It should be noted that, with each iteration, the absolute value of VOLTAGE_MEASURED decreases, i.e., approaches zero, because controller 50 adjusts the resistance values of variable resistors 52 and 54 in a manner that causes the absolute value of the differential output voltage to decrease. It is important to note that output voltage is directly related to second-order intermodulation product, which is the circuit characteristic that the invention seeks to minimize.

Although in the illustrated embodiment variable resistors 52 and 54 are initialized to their midpoint values and then stepped in opposite directions until VOLTAGE_MEASURED is minimized, in other embodiments alternative methods can be used to seek the resistance values that result in a minimal VOLTAGE_MEASURED. For example, a binary search can be performed, in which the resistance values to which variable resistors 52 and 54 are set in each iteration are based on the results of previous iterations. In any case, it should be noted that adjusting one of variable resistors 52 and 54 upwards and the other of variable resistors 52 and 54 downwards causes the DC voltages across each of resistors 52 and 54 to differ. Causing variable current source 56 to inject a DC current compensates for this DC voltage differential, i.e., effectively equalizes the DC voltages across resistors 52 and 54.

When it is determined at step 86 that VOLTAGE_MEASURED is not less than VOLTAGE_PREVIOUS, indicating the most recent adjustment to the resistance values did not result in a decrease in output voltage (i.e., VOLTAGE_MEASURED is greater than or equal to VOLTAGE_PREVIOUS and thus is as low as adjusting the resistance values can make it go), then the method proceeds to step 90. At step 90, controller 50 restores variable resistors 52 and 54 and variable current source 56 to their previous values, i.e., values at which the output voltage was found to have been as close to zero as it could be made to go. The calibration method ends. In an embodiment in which the method is performed in conjunction with manufacturing a mobile wireless telephone, mixer circuit 30 can then be integrated into the mobile wireless telephone. For example, in an embodiment in which receiver 20 is included in an integrated circuit chip (that also includes controller 50, either as a functional element of a programmed processor or as a separate device on the chip), the chip can be integrated into the mobile wireless telephone circuitry. Alternatively, the method can be performed at any other suitable time during the manufacturing process, such as after the mobile wireless telephone has been partly or fully assembled. In such an embodiment, electronically operated switches (not shown) can be included that isolate the RF signal input of mixer circuit 30 from LNA 34 (FIG. 2) and instead connect the RF signal input of mixer circuit 30 to a test signal output of controller 50.

When the output voltage is minimized, the corresponding second-order product is minimized. Note that by adjusting variable current source 56 along with variable resistors 52 and 54, a corrective DC current is applied that compensates for undesirable DC offset. For example, when one of variable resistors 52 and 54 is set to its maximum value (e.g., 212.6 ohms), and the other is set to its minimum value (e.g., 187.4 ohms), an additive DC current of −126 microamperes ($\mu A$) is applied across resistors 52 and 54, i.e., differentially, to generate a DC voltage correction of about 50.4 mV: −126 $\mu A$* (187.4 Ohms+212.6 Ohms)=50.4 mV. This offset voltage generated as a result of setting current source 56 cancels or precisely offsets the voltage offset generated due to setting resistors 52 and 54 to values that minimize the second-order product. In other words, the injected DC current of −126 $\mu A$ effectively reduces the DC current in resistor 52 by 126 $\mu A$ while it increases the DC current in resistor 54 by 126 $\mu A$.

While various embodiments of the invention have been described, it will be apparent to those of ordinary skill in the art that many more embodiments and implementations are possible that are within the scope of this invention. For example, although described above with reference to a wireless telephony transceiver of the WCDMA type, the mixer system and method can be included in any receiver having a mixer for downconverting an RF signal. Accordingly, the invention is not to be restricted except in light of the following claims.

What is claimed is:

1. A calibration method for minimizing second-order intermodulation product in a direct conversion radio receiver having a downconversion mixer, the downconversion mixer having a mixer transconductor, a switching quad, and variable resistor circuits and a variable current source circuit coupled between outputs of the switching quad, the calibration method comprising:

applying a test signal to received signal input nodes of the mixer transconductor;

measuring an output signal representing the second-order intermodulation product at output nodes of the switching quad; and varying resistances of the first and second variable resistor circuits while varying a current of the variable current source until the measured output signal is at a minimum value and the variable current source current compensates for DC offset voltage between the first and second variable resistor circuits.

2. A radio receiver downconversion mixer, comprising:

a first differential transistor pair circuit defining a mixer transconductor, the mixer transconductor having a received signal input node, the transconductor converting a signal received at the received signal input node into a current signal;

a switching quad having a current input, a local oscillator signal input, and output node, the current input receiving the current signal from the transconductor;

first and second variable resistor circuits coupled between the output nodes of the switching quad and a supply voltage node;

a variable current source circuit coupled between the output nodes of the switching quad;

wherein the first and second variable resistor circuits are set to resistances at which second-order intermodulation product is minimized, and the settable current source is set to a value that counteracts direct-current (DC) offset voltage between the first and second variable resistor circuits.

3. The radio receiver downconversion mixer claimed in claim 2, wherein the radio receiver downconversion mixer is included in a wireless telephony device.

4. A controller for calibrating a radio receiver downconversion mixer to minimize second-order intermodulation product, the downconversion mixer having a mixer transconductor, a switching quad, and variable resistor circuits and a variable current source circuit coupled between outputs of the switching quad, the controller comprising:

logic for applying a test signal to received signal input nodes of the mixer transconductor;

logic for measuring an output signal at output nodes of the switching quad; and logic for varying resistances of the first and second variable resistor circuits while varying a current of the variable current source until the measured output signal is at a minimum value and the variable current source current compensates for offset voltage between the first and second variable resistor circuits.

5. The controller claimed in claim 4, wherein the controller is integrated with the downconversion mixer in a wireless telephony device.

6. The controller claimed in claim 4, wherein the controller is a calibration tool used in manufacturing a wireless telephony device.

\* \* \* \* \*